(12) United States Patent
Kinoshita et al.

(10) Patent No.: US 6,300,594 B1
(45) Date of Patent: Oct. 9, 2001

(54) METHOD AND APPARATUS FOR MACHINING AN ELECTRICALLY CONDUCTIVE FILM

(75) Inventors: Makoto Kinoshita; Takeshi Kobayashi, both of Tottori (JP)

(73) Assignee: Ricoh Microelectronics Company, Ltd., Tottori (JP)

( * ) Notice: Subject to any disclaimer, the term of this patent is extended or adjusted under 35 U.S.C. 154(b) by 0 days.

(21) Appl. No.: 09/252,223

(22) Filed: Feb. 18, 1999

(30) Foreign Application Priority Data

Feb. 19, 1998 (JP) .................................................. 10-056153
Feb. 19, 1998 (JP) .................................................. 10-056156
Mar. 20, 1998 (JP) .................................................. 10-092387
Feb. 12, 1999 (JP) .................................................. 11-035071

(51) Int. Cl.[7] .................................................. B23K 26/38
(52) U.S. Cl. .............................. 219/121.69; 219/121.68; 219/121.82; 219/121.83
(58) Field of Search ........................ 219/121.69, 121.68, 219/121.83, 121.61, 121.62, 121.82

(56) References Cited

U.S. PATENT DOCUMENTS

| 4,680,855 | 7/1987 | Yamazaki et al. . |
|---|---|---|
| 4,734,550 | * 3/1988 | Imamura et al. . |
| 4,877,481 | 10/1989 | Fukuda et al. . |
| 5,661,744 | 8/1997 | Murakami et al. . |

FOREIGN PATENT DOCUMENTS

| 0 304 015 | 2/1989 | (EP) . |
|---|---|---|
| 0 927 595 | 7/1999 | (EP) . |
| 61-242780 | * 10/1986 | (JP) . |
| 2-70394 | * 3/1990 | (JP) . |
| 4-100685 | * 4/1992 | (JP) . |
| 9-189675 | * 7/1997 | (JP) . |
| WO 90/09730 | 8/1990 | (WO) . |
| WO 97/18920 | 5/1997 | (WO) . |

OTHER PUBLICATIONS

Patent Abstracts of Japan, vol. 16, No. 335 (M1283), Jul. 21, 1992, JP 04 100685, Apr. 2, 1992.

* cited by examiner

Primary Examiner—Geoffrey S. Evans
(74) Attorney, Agent, or Firm—Oblon, Spivak, McClelland, Maier & Neustadt, P.C.

(57) ABSTRACT

A method and apparatus for machining an electrically conductive film at a low cost, suitable for multi-product small-amount production are provided to reduce variations in resulting dimensions, a partially remaining conductive film, damage to an insulating substrate, and so on after machining, while eliminating the need for a waste liquid treatment. The apparatus includes a YAG laser for emitting near infrared light (at wavelength $\lambda=1064$ nm), an optical system including a step index optical fiber for guiding the laser light emitted from the laser to the vicinity of an electrically conductive film on an insulating transparent substrate, an X-Y stage having a carrier for carrying the transparent substrate thereon, and a controller for controlling and driving the X-Y stage to move the transparent substrate in a direction orthogonal to a direction in which the laser light is irradiated. Instead of the optical fiber, a kaleidoscope may be used. The carrier can include a recess below at least a portion of the workpiece, which can be a touch panel or liquid crystal panel.

15 Claims, 11 Drawing Sheets

METHOD AND APPARATUS FOR MACHINING AN ELECTRICALLY CONDUCTIVE FILM

Japanese Patent Application 10-056153 filed Feb. 19, 1998, Japanese Patent Application 10-056156 filed Feb. 19, 1998, Japanese Patent Application 10-092387 filed Mar. 20, 1998, and Japanese Patent Application 11-035071 filed Feb. 12, 1999 are hereby incorporated by references.

BACKGROUND OF THE INVENTION

1. Field of the Invention

The present invention relates generally to a method and apparatus for machining an electrically conductive film, and more particularly to a method and apparatus for removing portions of an electrically conductive film formed on an insulating substrate for patterning electrodes on the surface of the insulating substrate that forms part of a touch panel, a liquid crystal panel, or the like.

2. Description of the Related Art

Conventionally, touch panels have been used as means for users to input information to a variety of electronic devices. In addition, liquid crystal panels have been used as display means associated with electronic devices. Such touch panels and liquid crystal panels are constructed such that a pair of insulating substrates having transparent electrodes, each made of a transparent conductive film, formed on respective surfaces thereof are bonded so that the transparent electrodes are opposite to each other. In addition, for a touch panel, the pair of substrates are arranged in opposition with a spacer having a predetermined height (for example, 9–12 $\mu$m) interposed therebetween to prevent the transparent electrodes from contacting each other in a normal state.

The respective transparent electrodes formed on the surface of the insulating substrate are separated by slit-like gaps to prevent adjacent transparent electrodes from contacting each other. Conventionally, the transparent electrodes on the insulating substrate have been formed mainly by a photolithographic method including etching processing. The photolithographic method involves forming an electrically conductive film over an entire surface of an insulating substrate by vacuum deposition or the like, forming a resist pattern on the electrically conductive film, and then removing exposed portions of the electrically conductive film by an etchant which dissolves such exposed portions.

The use of the photolithographic method, however, is not so favorable from a viewpoint of environmental preservation, because the photolithographic method involves wasted photoresist developing solution, etchant and so on.

In addition, when a pattern and/or shape of transparent electrodes are to be changed, a mask must be newly created from the photolithographic method, so that the photolithographic method experiences a low machining efficiency, and difficulties in supporting multi-product small-amount production and reducing the cost. Particularly, even the formation of several slits through an electrically conductive film on an insulating substrate as is the case of a hybrid type touch panel requires the same photolithographic process as a digital type touch panel which involves the formation of several hundred slits. Therefore, reduction in waste liquids and cost has been difficult although conductive film are machined only in small areas.

As a method and apparatus for machining an electrically conductive film that are free from the need for a waste liquid treatment, which has been involved in the photolithographic method including etching processing, inexpensive, and suitable for multi-product small-amount production, it is contemplated that a laser beam is irradiated as an energy beam. However, experiments and so on diligently conducted by the present inventors on the machining of a electrically conductive film with the laser irradiation have revealed that an energy distribution on the cross section of laser light may cause troubles such as irregular widths and undulated shapes of machined slits, a portion of conductive film left unremoved, a deeply excavated insulating substrate at a position corresponding to the center of laser light, and so on.

It should be noted that the above-mentioned troubles such as variations in machined dimensions, partially unremoved conductive film, damaged insulating substrate and so on could be experienced not only when an electrically conductive film is irradiated with the laser light for machining but also when it is machined through irradiation with a light beam other than a laser beam, and other energy beams such as an X-ray beam, a charged particle beam and so on.

OBJECT AND SUMMARY IN THE INVENTION

The present invention has been made in view of the problems mentioned above, and its object is to provide a method and apparatus for machining an electrically conductive film at a low cost, suitable for multi-product small-amount production, which is less prone to variation in resulting dimensions, a partially remaining conductive film, damages to an insulating substrate, and so on after machining, while eliminating the need for a waste liquid treatment, which would be required when the photolithographic method including etching processing is employed.

To achieve this and other objects, according to a first aspect, the present invention provides a method of machining an electrically conductive film formed on a surface of an insulating substrate to remove portions of the electrically conductive film, which includes the steps of making uniform an energy distribution on a cross section of an energy beam, selectively irradiating the uniform energy beam to the electrically conductive film on the insulating substrate, and removing portions of the electrically conductive film.

In the method according to the first aspect, since the energy beam is selectively irradiated to the electrically conductive film on the insulating substrate to remove or machine portions of the electrically conductive film, the need for a waste liquid treatment, which would be required when using a photolithographic method including etching processing, is eliminated. In addition, since a portion to be removed of the electrically conductive film on the insulating substrate can be varied by changing a position to which the energy beam is irradiated, the method of the present invention is less expensive and more preferable for multi-product small-amount production at compared with the photolithographic method which involves creation of a new mask.

Also, since the energy distribution on the cross section of the laser light irradiated to the electrically conductive film is made uniform, the method of the present invention can reduce variations in resulting dimensions, a partially remaining conductive film, damages to an insulating substrate, and so on after machining.

Preferably, the energy beam is laser light. In this case, the laser light is selectively irradiated to the electrically conductive film on the insulating substrate to remove or machine portions of the electrically conductive film. Also, a portion to be removed of the electrically conductive film on the insulating substrate can be varied by changing a position to which the laser light is irradiated.

Also preferably, the insulating substrate and the electrically conductive film are transparent, and the step of irradiating the energy beam includes forming a slit through the transparent conductive film on the transparent insulating substrate.

Since the transparent conductive film on the transparent insulating substrate is formed with a slit by irradiating the energy beam thereto, a touch panel, a liquid crystal panel or the like having transparent electrodes can be produced at a lower cost in a multi-product small-amount production scheme without requiring a waste liquid treatment which would be involved in the photolithographic method including etching processing.

In addition, since the energy distribution on the cross section of the energy beam irradiated to the electrically conductive film is made uniform, the method of the present invention can reduce variations in the width of a resulting slit formed through the electrically conductive film, a partially remaining conductive film in the slit, damages to an insulating substrate on the bottom of the slit, and so on.

In a method of machining an electrically conductive film, particularly adapted to machine an electrically conductive film which has a wiring pattern made of an electrically conductive paste formed thereon, an energy beam is irradiated to form slits along the wiring pattern on the electrically conductive film for providing insulation between wires formed in the wiring pattern.

In this method, since the energy beam is irradiated to the electrically conductive film to form slits along the wiring pattern on the electrically conductive film for providing insulating between wires, a touch panel, a liquid crystal panel or the like having a wiring pattern in an outer peripheral portion can be produced at a lower cost in a multi-product small-amount production scheme without requiring a waste liquid treatment which would be involved in the photolithographic method including etching processing.

In addition, since the energy distribution on the cross section of the energy beam irradiated to the electrically conductive film is made uniform, the method of the present invention can reduce variations in the width of resulting slits formed through the electrically conductive film for providing insulation between wires, a partially remaining conductive film in the slits, damages to an insulating substrate on the bottom of the slits, and so on.

The slits for providing insulating between wires may be formed before an electrically conductive paste is applied on the wiring pattern, or after the electrically conductive paste is applied.

According to a second aspect, the present invention provides an apparatus for machining an electrically conductive film formed on a surface of an insulating film to remove portions of the electrically conductive film, which includes an energy beam source for emitting an energy beam, and a beam irradiating mechanism for making uniform an energy distribution on a cross section of the energy beam from the energy beam source, and for selectively irradiating the uniform energy beam to the electrically conductive film on the insulating substrate.

In this apparatus, since the energy beam from the energy beam source is selectively irradiated to the electrically conductive film on the insulating substrate by the beam irradiating mechanism to remove or machine portions of the electrically conductive film, the need for a waste liquid treatment, which would be required when using a photolithographic method including etching processing, is eliminated. In addition, since a portion to be removed of the electrically conductive film on the insulating substrate can be varied by changing a position to which the energy beam is irradiated by the beam irradiating mechanism, the apparatus of the present invention is less expensive and more preferable for multi-product small-amount production as compared with the photolithographic method which involves creating of a new mask.

Also, since the energy distribution on the cross section of the energy beam irradiated to the electrically conductive film is made uniform by the beam irradiating mechanism, the apparatus of the present invention can reduce variations in resulting dimensions, a partially remaining conductive film, damages to an insulating substrate, and so on after machining.

Preferably, the apparatus further includes a substrate holding mechanism for holding the insulating substrate, and a control mechanism for controlling and driving at least one of the substrate holding mechanism and the beam irradiating mechanism to relatively move the insulating substrate and the energy beam irradiated to the substrate.

In this apparatus, the control mechanism controls and drives at least one of the substrate holding mechanism for holding the insulating substrate and the beam irradiating mechanism to relatively move the insulating substrate and an energy beam irradiated to the substrate, so that the energy beam is moved relative to the electrically conductive film on the insulating substrate to selectively remove portions of the electrically conductive film irradiated by the energy beam.

Also preferably, a path for irradiating the energy beam is fixed, and the control mechanism controls and drives the substrate holding mechanism to move the insulating substrate in a direction intersecting a direction in which the energy beam is irradiated.

In this case, the substrate holding mechanism is controlled and driven with the path for irradiating the energy beam being fixed, to move the irradiating substrate held by the substrate holding mechanism in a direction intersecting to a direction in which the energy beam is irradiated. In this way, the energy beam is moved relative to the electrically conductive film on the insulating substrate to selectively remove portions of the electrically conductive film irradiated by the energy beam.

Further preferably, the insulating substrate is fixed at a position, and the control mechanism controls and drives the beam irradiating mechanism to move a position irradiated by the energy beam in a direction intersecting to a direction in which the energy beam is irradiated.

In this case, the beam irradiating mechanism is controlled and driven with the position of the insulating substrate being fixed, to move a position irradiated by the energy beam in a direction intersecting to a direction in which the energy beam is irradiated. In this way, the energy beam is moved relative to the electrically conductive film on the insulating substrate to selectively remove portion of the electrically conductive film irradiated by the energy beam.

The energy beam source is preferably a light source for emitting laser light which serves as the energy beam, and the beam irradiating mechanism includes an optical system for making uniform the energy distribution on the cross section of the laser light from the light source, and for selectively irradiating the uniform laser light to the electrically conductive film on the insulating substrate.

Since the laser light from the light source is selectively irradiated to the electrically conductive film on the insulating substrate to remove or machine portions of the electrically conductive film, the need for a waste liquid treatment, which would be required when using a photolithographic method including etching processing, is eliminated. In addition, since a portion to be removed of the electrically conductive film on the insulating substrate can be varied by changing a position to which the laser light is irradiated by the optical system, the apparatus of the present invention is less expensive and more preferable for multi-product small-amount production as compared with the photolithographic method which involves creation of a new mask.

Also, since the energy distribution on the cross section of the laser light irradiated to the electrically conductive film is made uniform by the optical system, the apparatus of the present invention can reduce variations in resulting dimensions, a partially remaining conductive film, damages to an insulating substrate, and so on after machining.

The optical system for making uniform the energy distribution on the cross section of the laser light preferably includes a kaleidoscope. The energy distribution on the cross section of the laser light is made uniform using the kaleidoscope which is simple in structure, and readily manufactured at a low cost.

Preferably, the apparatus further includes an optics for converging laser light exiting the kaleidoscope onto the electrically conductive film.

Since the converged laser light exiting the kaleidoscope is irradiated onto the electrically conductive film by the optics to reduce an irradiating area of the laser light irradiated onto the electrically conductive film, the energy density of the laser light can be increased, and even smaller sized machining patterns can be realized.

The optical system for making uniform the energy distribution on the cross section of the laser light preferably includes an optical fiber for making uniform the energy distribution of the laser light emitted from the light source through refraction and reflection in an internal light transmission path, while guiding the laser light to the vicinity of the electrically conductive film on the insulating substrate.

In this case, the laser light emitted from the light source is guided by the optical fiber to the vicinity of the electrically conductive film on the insulating substrate. While the laser light is guided by the optical fiber, light rays incident on the optical fiber at different angles from each other are multiplexedly refracted and reflected along a light transmission path inside the optical fiber, thereby making uniform an energy density on a cross section of the light beam exiting the optical fiber. The laser light exiting the optical fiber with a uniform energy distribution is irradiated onto the electrically conductive film on the insulating substrate to machine the electrically conductive film.

Also preferably, the optical fiber is a step-index type optical fiber having a core about a central axis.

While the laser light emitted from the light source is guided by the optical fiber, light rays incident on the optical fiber at different angles from each other are multiplexedly reflected by the core inside the optical fiber, thereby making uniform an energy density on a cross section of the light beam exiting the optical fiber.

The apparatus preferably includes an optics for converging laser light exiting the optical fiber onto the electrically conductive film.

Since the converged laser light exiting the optical fiber is irradiated onto the electrically conductive film by the optics to reduce an irradiating area of the laser light irradiated onto the electrically conductive film, the energy density of the laser light can be increased, and even smaller sized machining patterns can be realized.

In the apparatus, the insulating substrate and the electrically conductive film are transparent, and the energy beam is irradiated to form a slit through the transparent conductive film on the transparent insulating substrate.

Since the transparent conductive film on the transparent insulating substrate is formed with a slit by irradiating the energy beam thereto, a touch panel, a liquid crystal panel or the like having transparent electrodes can be produced at a lower cost in a multi-product small-amount production scheme without requiring a waste liquid treatment which would be involved in the photolithographic method including etching processing.

In addition, since the energy distribution on the cross section of the energy beam irradiated to the electrically conductive film is made uniform, the apparatus of the present invention can reduce variations in the width of resulting slits formed through the electrically conductive film, a partially remaining conductive film in the slits, damages to an insulating substrate on the bottom of the slits, and so on.

In an apparatus particularly adapted to machine an electrically conductive film which has a wiring pattern made of an electrically conductive paste formed thereon, the apparatus includes an energy beam source for emitting an energy beam, and a beam irradiating mechanism for making uniform an energy distribution on a cross section of the energy beam from the energy beam source, and for selectively irradiating the uniform energy beam to the electrically conductive film on the insulating substrate to form slits along the wiring pattern on the electrically conductive film for providing insulation between wires.

In this apparatus, since the energy beam is irradiated to the electrically conductive film to form slits along the wiring pattern on the electrically conductive film for providing insulation between wires, a touch panel, a liquid crystal panel or the like having a wiring pattern in an outer peripheral portion can be produced at a lower cost in a multi-product small-amount production scheme without requiring a waste liquid treatment which would be involved in the photolithographic method including etching processing.

In addition, since the energy distribution on the cross section of the energy beam irradiated to the electrically conductive film is made uniform, the apparatus of the present invention can reduce variations in the width of resulting slits formed through the electrically conductive film for providing insulation between wires, a partially remaining conductive film in the slits, damages to an insulating substrate on the bottom of the slits, and so on.

Other objects, features, and advantages of the present invention will become apparent from the following detailed description when read in conjunction with the accompanying drawings.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
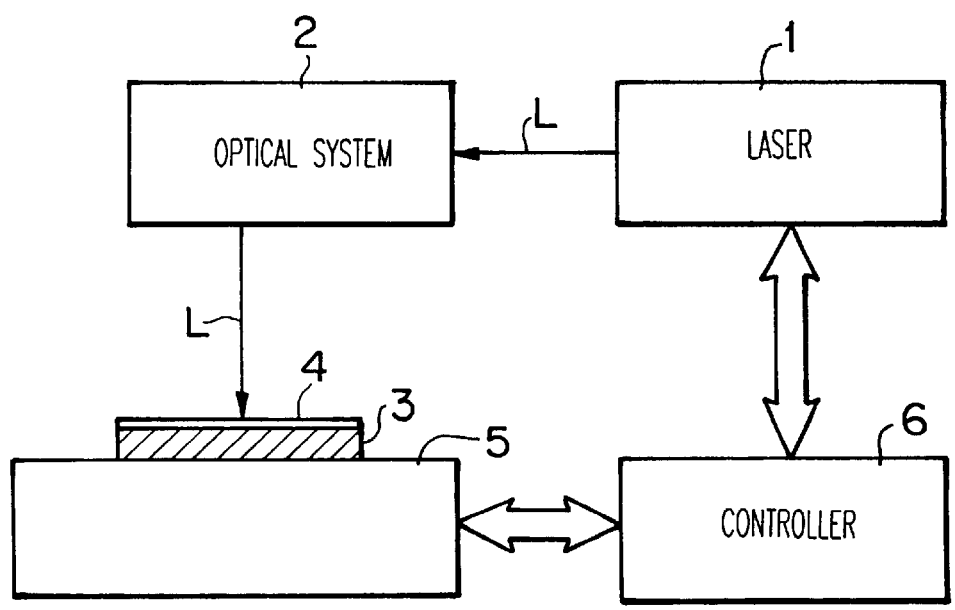
FIG. 1 is a schematic diagram generally illustrating a machining apparatus according to a first embodiment of the present invention.

The present invention will hereinafter be described for several embodiments in which the present invention is applied to an apparatus for machining an electrically conductive film on a transparent insulating substrate for use in a hybrid type touch panel to remove portions of the electrically conductive film in a slit pattern to form transparent electrodes.

In describing preferred embodiments of the present invention illustrated in the drawings, specific terminology is employed for the sake of clarity. However, the present invention is not intended to be limited to the specific terminology to selected and it is to be understood that each specific element includes all technical equivalents which operate in a similar manner.

Referring now to the drawings, wherein like reference numerals designate identical or corresponding parts throughout the several views, and more particularly to FIG. 1 thereof, there is illustrated an exemplary configuration of a machining apparatus according to a first embodiment of the present invention. In FIG. 1, near infrared laser light L (at wavelength $\lambda$=1064 nm) emitted from a Q-switch controlled Nb:YAG laser 1 serving as an energy beam source (light source) is selectively irradiated to an electrically conductive film 4 made of a transparent material (ITO) on an insulating substrate 3 made of a transparent plastic material (for example, PET, polycarbonate) through an optical system 2 including a mirror and so on. The insulating substrate 3 is fixed on a carrier, not shown, on an X-Y stage 5 serving as a substrate holding means, which contains a linear motor, and is movable together with the carrier in the horizontal direction on the drawing. The YAG laser 1 and the X-Y stage 5 may be controlled by a controller 6 serving as a control means. For example, a driver for the YAG laser 1 may be controlled to change a repeating period, a pulse width and so on of the laser light. Also, the linear motor in the X-Y stage 5 may be controlled and driven in accordance with the power of the laser light from the laser 1 to move the insulating substrate 3. Alternatively, a sensor for sensing a moving distance of the X-Y stage 5 may be provided to perform a feedback control in response to the output of the sensor.

Figure 2:
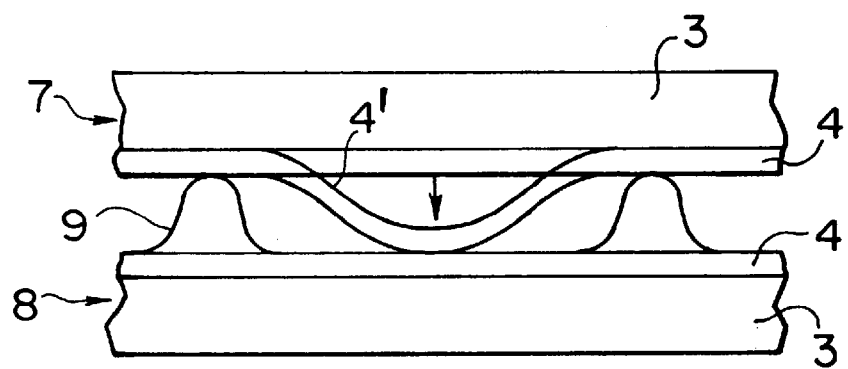
FIG. 2 is an enlarged cross-sectional view of a touch panel.
Figure 3A:
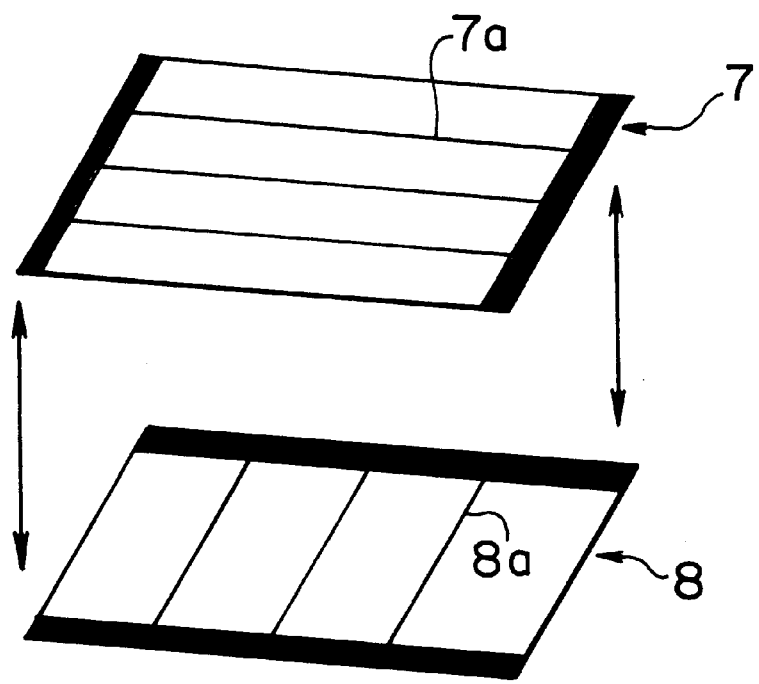
FIG. 3A is a exploded perspective view of a touch panel.
Figure 3B:
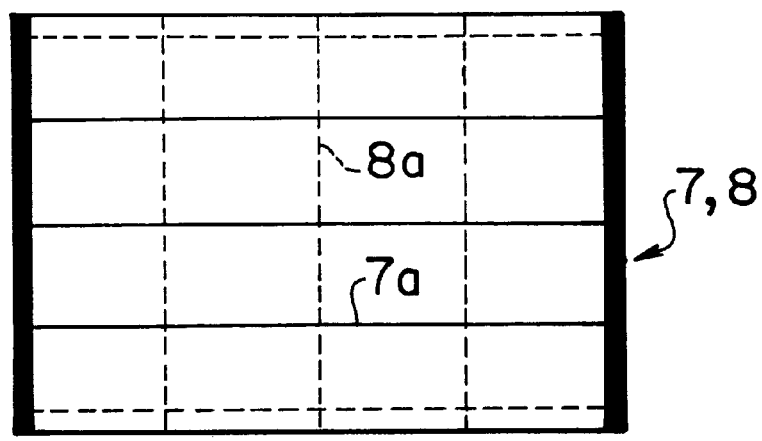
FIG. 3B is a top plan view of the touch panel.

FIG. 2 illustrates in a cross-sectional view a touch panel which is machined by the machining apparatus according to the first embodiment. FIGS. 3A and 3B are an exploded perspective view and a plan view of the touch panel, respectively.

As illustrated in FIG. 2, the touch panel has a pair of upper and lower touch panel substrates 7, 8 opposing each other with a spacer 9 of a predetermined height (for example, from 9 to 12 $\mu$m) interposed therebetween such that transparent electrodes, each made of an electrically conductive film 4, on the opposing surfaces of the respective substrates do not come in contact with each other in a normal state. When the touch panel is pressed from the above in FIG. 2, the upper touch panel substrate 7 is deformed as indicated by lines specified by numeral 4' to bring the transparent electrodes on the upper and lower touch panel substrates 7, 8 into contact with each other. From a change in resistance between the upper and lower transparent electrodes due to this contact, it can be known whether or not the touch panel is pressed, and where a pressed position is. The illustrated touch panel is a hybrid type which is a combination of an analog type and a digital type, and has mutually orthogonal slits 7a, 8a formed through the respective conductive films on the upper and lower touch panel substrates, 7, 8, as illustrated in FIG. 3A.

The machining apparatus according to the first embodiment is adapted to form the slits on the electrically conductive film 4 as illustrated in FIGS. 3A and 3B. The insulating substrate 3 formed with the electrically conductive film 4 (having a thickness of approximately 500 angstroms) on a surface by vacuum vapor deposition, ion plating, sputtering or the like is set on the X-Y stage 5 with the surface formed with the electrically conductive film 4 oriented upward. Then, the X-Y stage 5 is moved in one direction while the laser light L, narrowed down to a predetermined spot diameter, is irradiated to the electrically conductive film 4 on the insulating substrate 3, to remove the electrically conductive film 4 in a width of approximately 500 to 1000 μm through evaporation by the heat of the laser light, thus forming a slit which insulates resulting electrode regions.

Figure 4A:
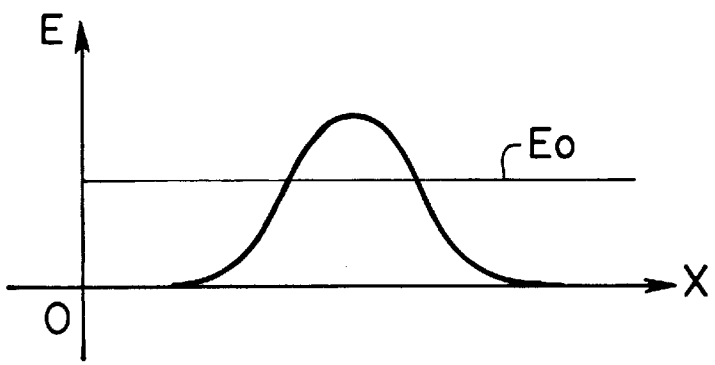
FIG. 4A is a graph for explaining an energy distribution on the cross section of laser light before passing through a kaleidoscope.
Figure 4B:
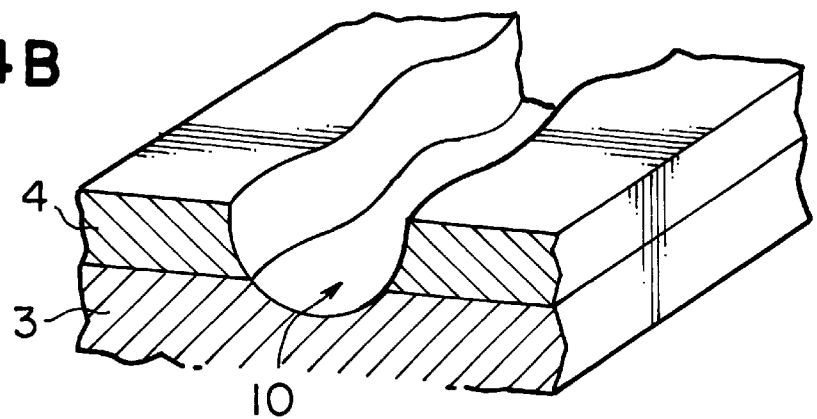
FIG. 4B is a perspective view of an electrically conductive film on an insulating substrate after it has been machined with the laser light of FIG. 4A.
Figure 4C:
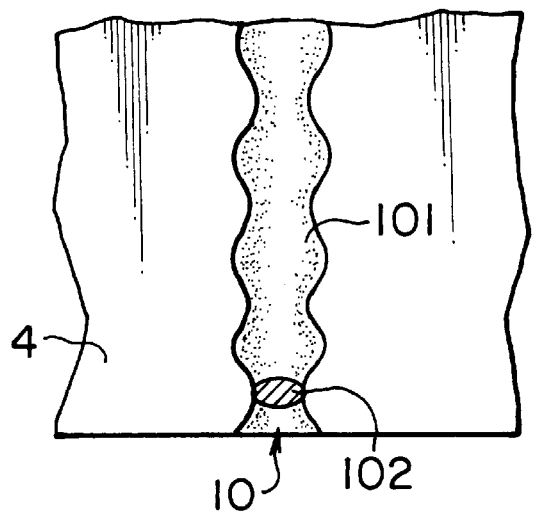
FIG. 4C is a top plan view of the electrically conductive film on the insulating substrate.

An energy distribution on the cross section of the laser light L emitted from the YAG laser 1 has a Gaussian profile as illustrated in FIG. 4A which presents a peak at the center. A level indicated by reference Eo in FIG. 4A indicates a threshold value for removing the electrically conductive film 4 with the laser light. When a laser light having an energy distribution represented by such a profile is irradiated as it is to remove the electrically conductive film 4 on the insulating substrate 3, a resulting slit 10 does not have a constant width but an undulated shape as illustrated in FIGS. 4B and 4C. The undulated slit thus formed is highly prone to a leak due to moisture and a leak due to an electrically conductive foreign substance 102 (FIG. 4C) bridging the adjacent conductive regions over the slit. Also, prominent edges of the undulated slit 10 are not favorable from a view point of the visibility of the transparent electrode. Further, the width of the slit 10 is difficult to control, and a portion of the electrically conductive film to be removed may often remain to result in machining residue 101. This machining residue 101 also causes a higher visibility. Furthermore, as illustrated in FIG. 4B, the underlying insulating substrate 3 may by deeply excavated at a position corresponding to the center of the laser light L due to the energy distribution of the laser light L, and a machined portion may be burnt by the laser light L to stain, thereby making the slit more visible.

Figure 5:
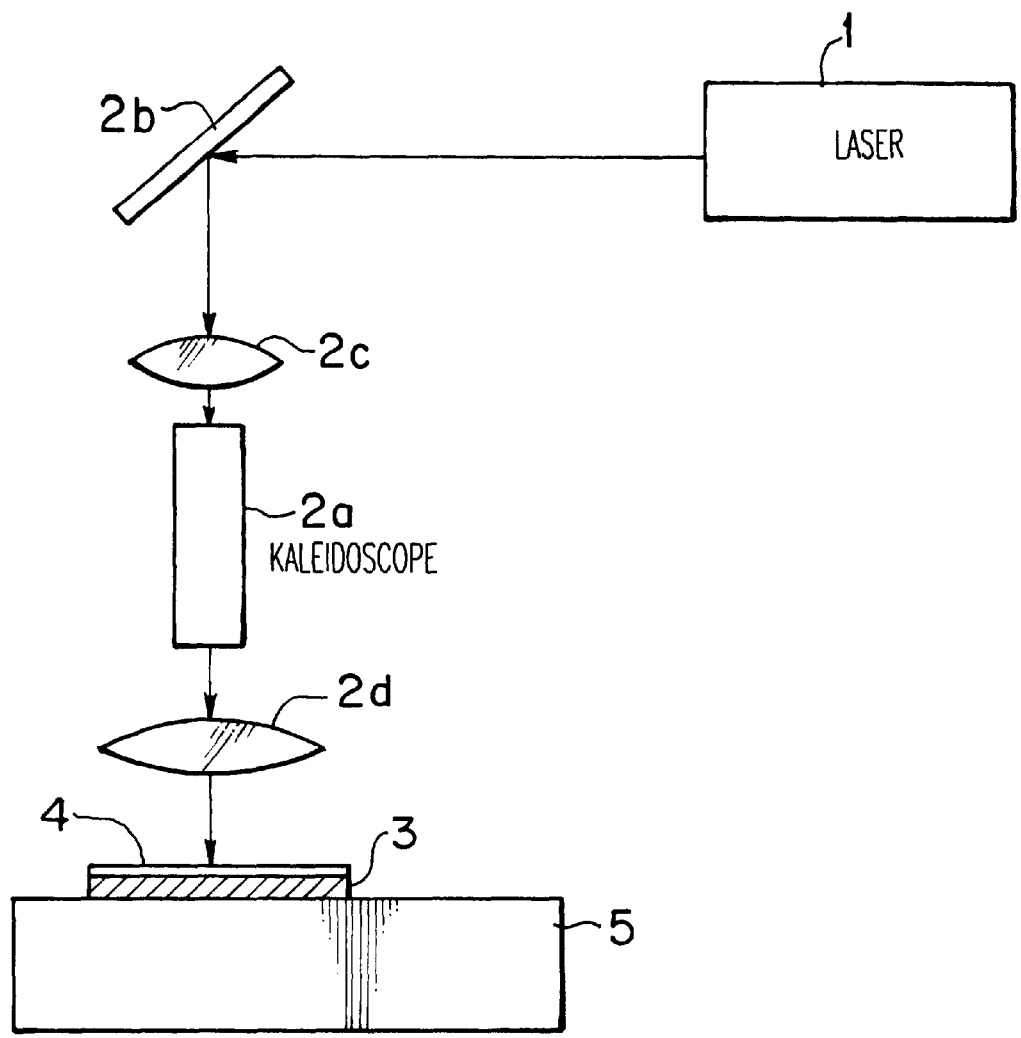
FIG. 5 is a schematic diagram illustrating the configuration of a machining apparatus including an optical system using a kaleidoscope.

To solve a variety of problems caused by the energy distribution of the laser light as mentioned above with reference to FIG. 4A, in the first embodiment, the optical system 2 is provided with a kaleidoscope 2a including four mirrors which is simple in structure and manufactured at a low cost. FIG. 5 illustrates an exemplary structure of the kaleidoscope 2a. The kaleidoscope 2a serves as a uniform energy distribution forming means for providing a uniform energy distribution on the cross section of the laser light L. Referring to FIG. 5, the laser light L from the YAG laser 1 is reflected off a mirror 2b, and then introduced into the kaleidoscope 2a through a lens 2c. The laser light L with a uniform energy distribution exiting the kaleidoscope 2a is converged on the electrically conductive film 4 by a lens 2d, which is an optics, so that it is irradiated onto the electrically conductive film 4 in a spot shape.

Figure 6A:
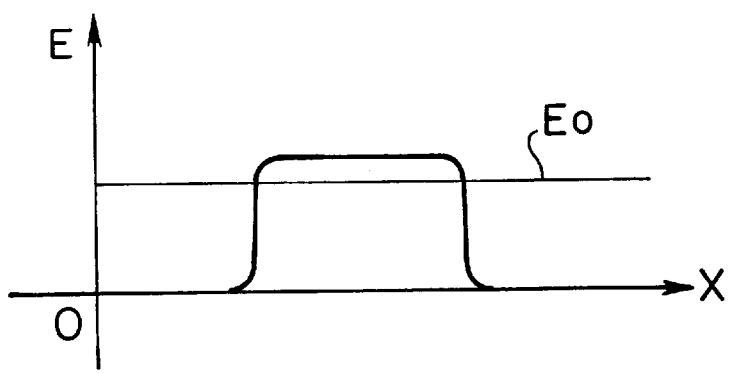
FIG. 6A is a graph for explaining an energy distributor on the cross section of a laser light after passing through the kaleidoscope.
Figure 6B:
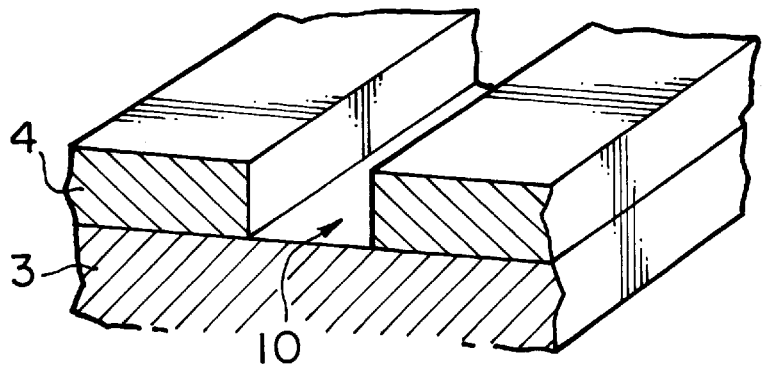
FIG. 6B is a perspective view of an electrically conductive film on an insulating substrate when it has been machined with the laser light of FIG. 6A.
Figure 6C:
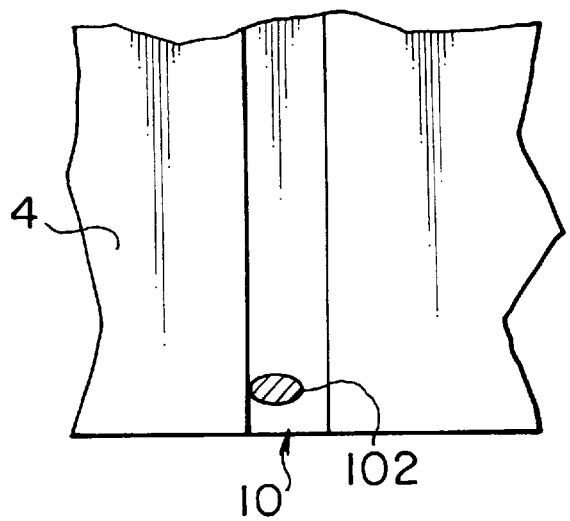
FIG. 6C is a top plan view of the electrically conductive film on the insulating substrate.

By using the kaleidoscope 2a to reshape the energy distribution of the cross section of the laser light L irradiated to the electrically conductive film 4 on the insulating substrate 3 such that the energy of the laser light L is fixed at a level slightly exceeding the threshold value Eo as illustrated in FIG. 6A, the slit 10 can be formed uniformly in a predetermined width as illustrated in FIGS. 6B and 6C. The resulting slit is thus less prone to a leak due to moisture and a leak due to an electrically conductive foreign substance 102 attached to the slit. In addition, edges of the slit 10 are less prominent. Further, the width of the slit 10 can be readily controlled. The removal of the electrically conductive film 4 with the laser light L with uniformly distributed energy prevents the machined conductive film 4 from partially remaining, so that machining residue is reduced. The underlying insulating substrate 3 will not be deeply excavated at the position corresponding to the center of the laser light L as illustrated in FIG. 6B. Also, since the machined portion is not burnt by the laser light to stain, the visibility of the slit will not be increased.

As described above, according to the first embodiment, since portions of the transparent conductive film on the insulating substrate are removed by irradiating laser light thereto, a touch panel having transparent electrodes can be produced at a low cost in a multi-product small-amount scheme without the need for a waste liquid treatment which would be involved in the photolithographic method including etching processing.

In addition, since the laser light L employed herein is infrared or visible laser light emitted from the YAG laser 1 as a heating laser to remove portions of the electrically conductive film 4 mainly through evaporation by the heat of the laser light, the insulating substrate 3 (made of PET, polycarbonate, or the like) underlying the electrically conductive film 4 is less prone to staining, damages, and so on.

Furthermore, since the use of the Q-switch controlled YAG laser 1 to change a repeating period and an irradiating duration (pulse width) of the laser light enables different settings to the thermal energy given to the electrically conductive film 4, the machining process for removing the electrically conductive film 4 can be readily controlled.

It should be noted that while the first embodiment employs a YAG laser as the heating laser, other lasers such as a carbonic acid gas laser may also be employed as long as they can emit infrared or visible laser light.

Also, while in the first embodiment, the laser light L from the YAG laser 1 is irradiated to the electrically conductive film 4 in a spot shape, the optical system may be configured to form elongated laser light L which is irradiated to the electrically conductive film 4.

Figure 7A:
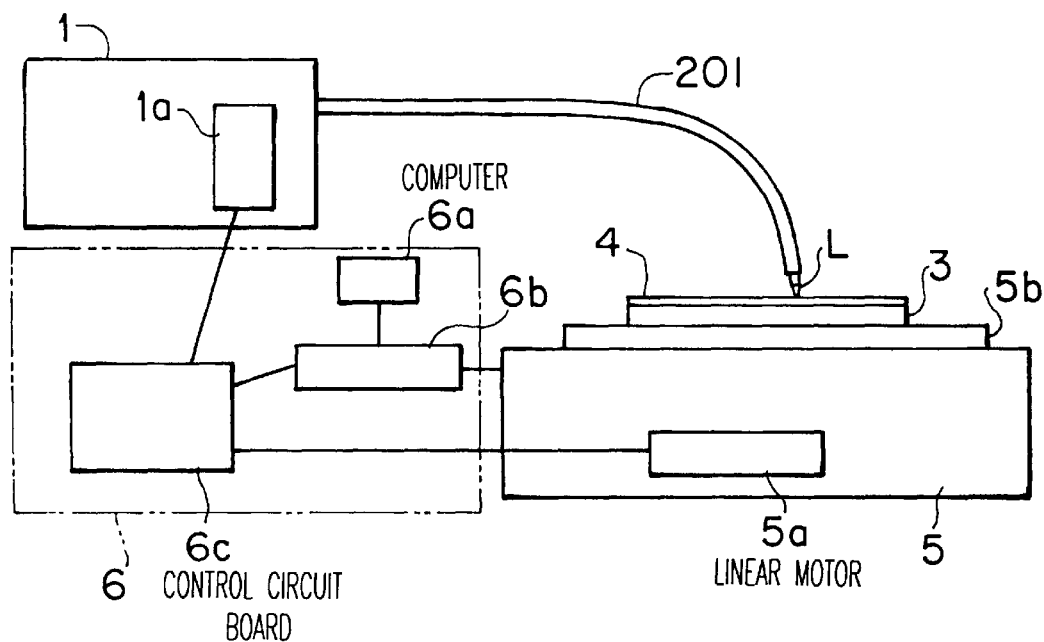
FIG. 7A is a schematic diagram generally illustrating a machining apparatus according to a second embodiment of the present invention.
Figure 7B:
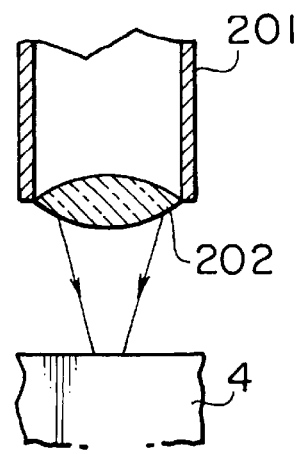
FIG. 7B is an enlarged cross-sectional view of an exit of an optical fiber used in the machining apparatus.

FIG. 7A generally illustrates the configuration of a machining apparatus according to a second embodiment of the present invention. Referring specifically to FIG. 7A, near infrared laser light (at wavelength λ=1064 nm) emitted from a YAG laser 1 as a energy beam source (light source) controlled by a Q switch 1a is guided by a step index type optical fiber 201 constituting an optical system as a beam irradiating means to the vicinity of the surface of an electrically conductive film 4 made of a transparent material (ITO) on an insulating substrate 3 made of a transparent plastic material (for example, PET, polycarbonate). The optical fiber 201 is provided with a micro-lens 202 integrally mounted to an exit (a light exiting end) thereof, as illustrated in FIG. 7B, for serving as an optics for converging the laser light L exiting the optical fiber 201 on the electrically conductive film 4. The laser light L converged by the micro-lens 202 is selectively irradiated to the electrically conductive film 4 to heat and evaporate an irradiated portion of the electrically conductive film 4, thereby making it possible to partially peel off or remove the electrically conductive film 4.

Since the converged laser light is irradiated to the electrically conductive film 4 on the insulating substrate 3 to reduce an irradiating area of the laser light irradiated onto the electrically conductive film 4, the energy density of the laser light can be increased to improve a machining efficiency. Moreover, since the converged laser light L can machine even smaller sized machining patterns, miniaturization of machining patterns can also be achieved.

Instead of attaching the micro-lens 202 to the exit of the optical fiber 201, a core at the light emitting end of the optical fiber 201 may be formed to protrude just like a convex lens. Such a protruding core like a convex lens can function to converge laser light exiting the optical fiber 201 and irradiate the converged laser light to the electrically conductive film 4.

In addition, the optical fiber 201 may also be provided with an additional micro-lens at an entrance for converging the near infrared laser light emitted from the YAG laser 1 and introducing the converged laser light into the core of the optical fiber 201.

The insulating substrate 3 intended for machining is fixed on a carrier 5b driven by a linear motor 5a of an X-Y stage 5 serving as a substrate holding means, such that the insulating substrate 3 is two-dimensionally movable together with the carrier 5b in a horizontal direction on the drawing. The YAG laser 1 and the X-Y stage 5 are controlled by a controller 6 serving as a control means which comprises a personal computer 6a, a sequencer 6b, a control circuit board 6c for synchronous sequential driving, and so on. For example, the controller 6 may control a driver for the YAG laser 1 to change a repeating period, a pulse width and so on of the laser light.

The controller 6 can also control and drive the linear motor 5a in the X-Y stage 5 in accordance with the power of the laser light from the YAG laser 1 to move the insulating substrate 3, or change the power of the laser light from the YAG laser 1 in accordance with movements of the carrier 5b. For example, the controller 6 may control the YAG laser 1 to change the repeating period, the pulse width or the like in real time in accordance with a moving speed of the carrier 5b for purposes of making the energy density of the laser light on the electrically conductive film 4 constant during acceleration to start moving the carrier 5b and deceleration to stop moving the carrier 5b to permit the formation of a uniformly machined shape (a tapered shape). This control results in a reduction in a total amount of movement of the carrier 5b. Specifically, without the control, an approach of approximately 100 nm is required in the prior art for acceleration and deceleration of the carrier 5b, so that the total amount of movement of the carrier 5b extends over 100 nm×700 nm. Since the control eliminates the approach, the total amount of movement of the carrier 5b can be reduced to approximately 500 nm×500 nm. Since the amount of movement of the carrier 5b can be reduced as mentioned, slits can be machined at a machining speed equivalent to or higher than the conventional etching process (for example, in approximately in a range of 35 to 15 seconds per substrate). It is also possible to improve the dimensional accuracy and prevent the substrate from burning and the electrically conductive film from remaining unmachined.

Alternatively, the X-Y stage 5 may be provided with a sensor for sensing a moving distance of the carrier 5b to feedback control the carrier 5b in response to the output of the sensor.

Also, for further increasing the machining speed, acceleration of the carrier 5b and the machining accuracy, the carrier 5b is preferably formed of a very light material such as foamed titanium, magnesium, alumina oxide based materials and aluminum alloy based materials. The carrier 5b may be formed with a throughhole extending an inner area thereof to reduce the weight. The throughhole may also function as an air flow path for vacuum chuck when a sheet-like material is to be machined.

Figure 8:
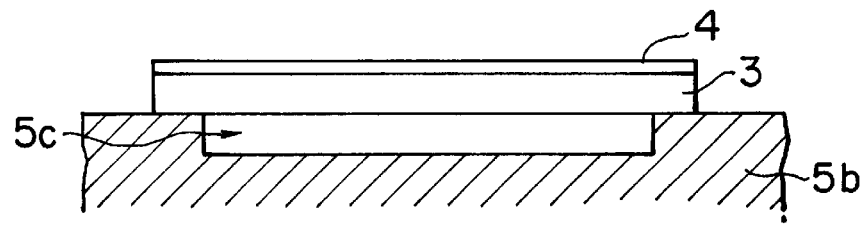
FIG. 8 is a cross-sectional view of a carrier, on which an insulating substrate is carried, according to a modified example.

As illustrated in FIG. 8, the carrier 5b is preferably formed with a recess 5c below at least portions of the insulating substrate 3 which are irradiated with the laser beam, such that a longer distance is ensured between the bottom surface of the insulating substrate 3 and the top surface of the carrier 5b. This structure can prevent laser light passing through the insulating substrate 3 and reflected off the surface of the carrier 5b from impinging on the electrically conductive film 4 to adversely affect the machining of the electrically conductive film 4.

In the machining apparatus according to the second embodiment as illustrated in FIG. 7A, the optical fiber 201 is used to reshape the energy distribution on the cross section of the laser light L irradiated to the electrically conductive film 4 on the insulating substrate 3 such that the energy of the laser light L is fixed at a level slightly exceeding the threshold value Eo as illustrated in FIG. 6A, so that the resulting slit 10 is formed constantly in a predetermined width, as illustrated in FIGS. 6B and 6C. Thus, the uniform slit 10 is less prone to a leak due to moisture and a leak due to an electrically conductive foreign substance 102 attached to the slit 10. In addition, edges of the slit 10 are less prominent. Further, the width of the slit 10 can be readily controlled. The removal of the electrically conductive film 4 with the laser light L with uniformly distributed energy prevents the machined conductive film 4 from partially remaining, so that machining residue is reduced. The underlying insulating substrate 3 will not be deeply excavated at the position corresponding to the center of the laser light L as illustrated in FIG. 6B. Also, since the machined portion is not burnt by the laser light to stain, the visibility of the slit will not be increased.

As described above, according to the second embodiment, since the transparent conductive film on the insulating substrate 3 is partially removed by irradiating laser light thereto, a touch panel having transparent electrodes can be produced at a low cost in a multi-product small-amount scheme without the need for a waste liquid treatment which would be involved in the photolithographic method including etching processing.

In additive, since the laser light irradiated to the electrically conductive film 4 is guided by the step index type optical fiber 201 to make uniform the energy distribution on the cross section of the laser light, the machining apparatus according to the second embodiment can reduce variations in resulting dimensions, a partially remaining conductive film, damages to an insulating substrate, and so on after machining.

It should be noted that while the second embodiment employs the step index type optical fiber 201, another type of optical fiber may also be used instead as long as it can guide laser light while making uniform the energy distribution thereof through refraction and reflection in an internal light transmission path. For example, it is possible to employ a hollow optical fiber which, unlike an ordinary optical fiber, is composed of a core (light transmission path) about the axis formed of a gas having a lower refractive index such as air, inert gas or the like, and a cladding around the core formed of a metal layer or a dielectric layer exhibiting a light transmittance.

Also, while the second embodiment employs the X-Y stage 5 to move the insulating substrate 3 to scan the laser light L on the electrically conductive film 4, the machining apparatus of the present invention may be configured to scan the laser light L using a scanning mechanism such as a galvano mirror or the like while maintaining the insulating substrate 3 stationary.

Figure 9:
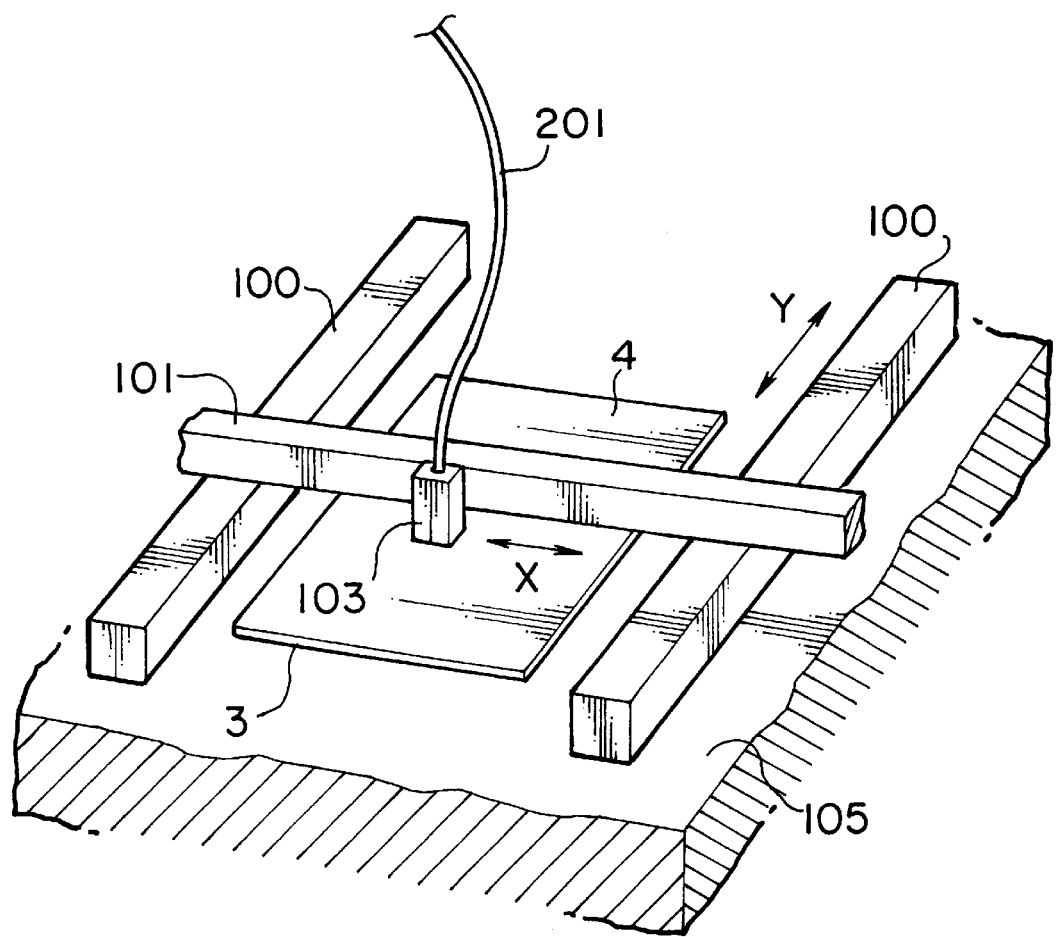
FIG. 9 is a perspective view schematically illustrating a laser beam moving mechanism in the machining apparatus according to the modified example.

In addition, as illustrated in FIG. 9, an optical fiber driving mechanism may be provided for moving the exiting end of the optical fiber 201, forming part of the beam irradiating means, along the surface of the electrically conductive film 4 in a direction intersecting the direction in which the laser light is irradiated, while the insulating substrate 3 is fixedly carried on the carrier 5b. The optical fiber driving mechanism may comprise a pair of Y-direction movable members 100 driven by a Y-direction driver, not shown, in a Y-direction in the drawing, and an X-direction movable member 101 driven by an X-direction driver, not shown, on the Y-direction movable members 100 in the direction orthogonal to the Y-direction. The light exiting end of the optical fiber 201 is fixed at substantially the center of the X-direction movable member 101 by a fixing member 103. A focusing optics is disposed at the light exiting end of the optical fiber 201, such that the laser light having a predetermined spot diameter can be irradiated onto the electrically conductive film 4 on the surface of the insulating substrate 3. The insulating substrate 3 in turn is fixedly placed on a table 105 serving as a carrier. Then, the X-direction driver and the Y-direction driver can be controlled by a controller, not shown, based on machining pattern data to machine the electrically conductive film 4 in a desired manner.

Figure 10A:
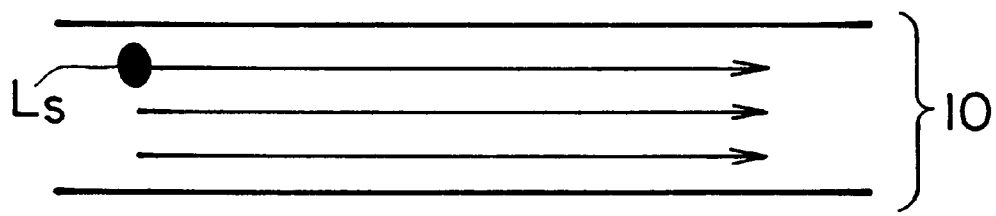
FIGS. 10A to 10C are explanatory diagrams for illustrating laser light scanning methods, respectively.
Figure 10B:
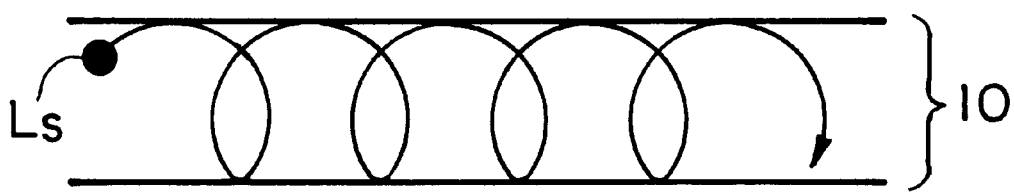
Figure 10C:
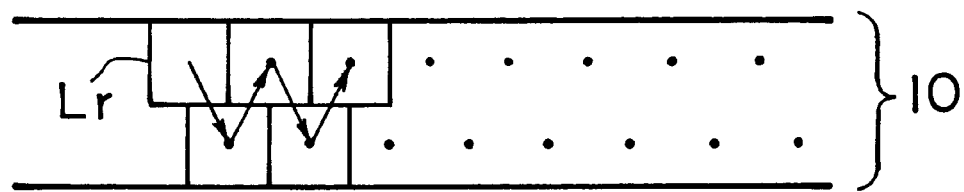

For scanning the laser light L on the electrically conductive film 4, scanning methods may be used as illustrated in FIGS. 10A to 10C. In FIG. 10A, laser light Ls of a circular spot is linearly scanned. In FIG. 10B, the laser light Ls of a circular spot is helically scanned. In FIG. 10C, laser light Lr of a square spot is scanned in a zig-zag pattern.

Figure 11:
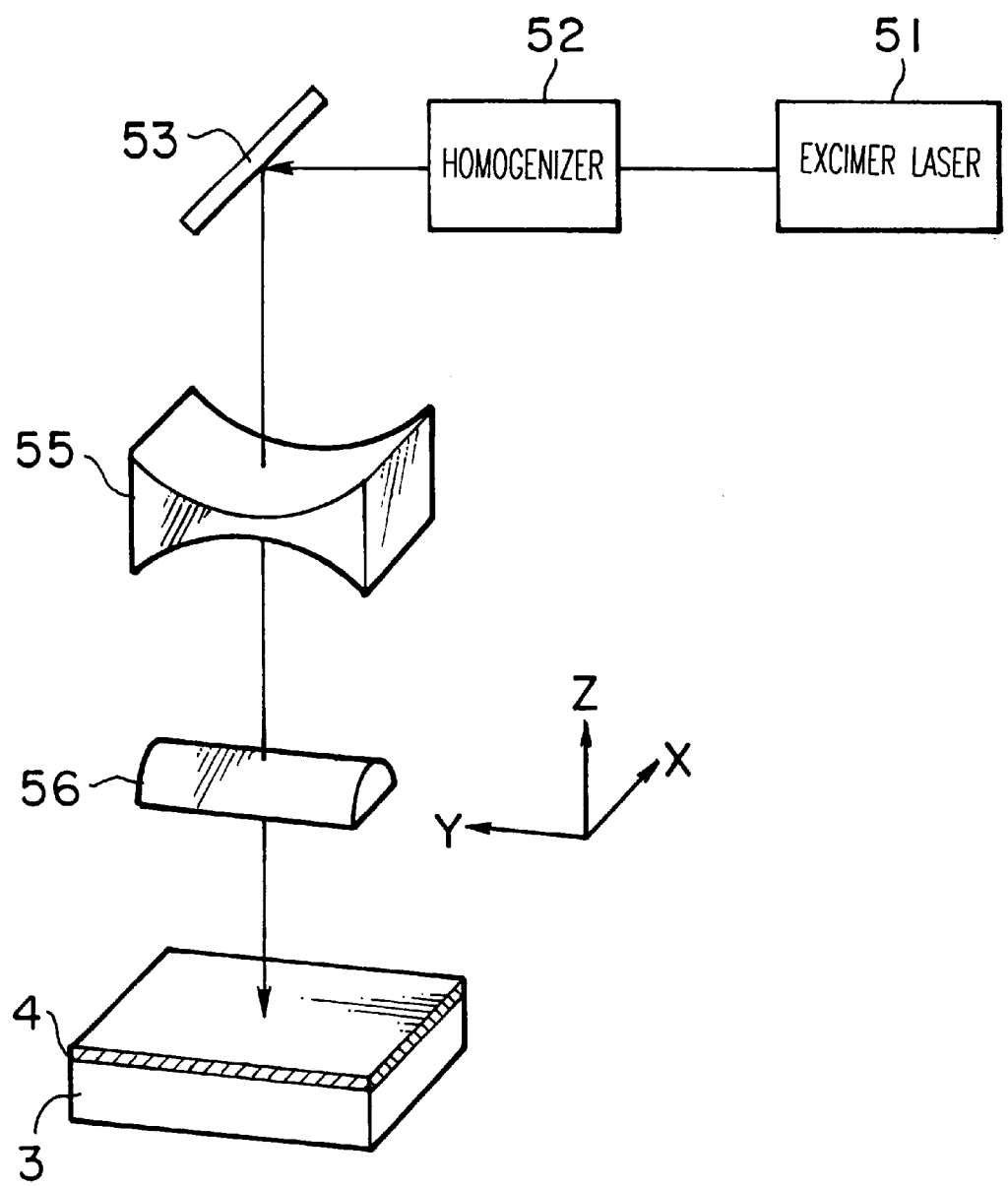
FIG. 11 is a schematic diagram generally illustrating the configuration of a machining apparatus according to a third embodiment of the present invention.

FIG. 11 generally illustrates the configuration of an apparatus for machining an electrically conductive film according to a third embodiment of the present invention. This machining apparatus comprises an excimer laser 51 serving as an energy beam source (light source); a beam irradiating means for making uniform an energy distribution on the cross section of laser light from the laser 51 and for selectively irradiating the uniform laser light to an electrically conductive film 4 on a transparent substrate 3 made of glass or the like serving as an insulating substrate; a stage serving as a substrate holding means having a carrier, not shown, on which the transparent substrate 3 is carried, for carrying the transparent substrate 3; and a controller, not shown, serving as a control means for controlling the position of the stage and for controlling the excimer laser 51.

The beam irradiating means comprises a homogenizer 52 serving as a uniform energy distribution forming means for making uniform the energy distribution (intensity distribution) of laser light L from the excimer laser 51; a mirror 53 for reflecting the laser beam to change its light path; an expander 55 for expanding the laser light reflected off the mirror 53 in one axial direction (for example, in a Y-axis direction); and a cylindrical lens 56 for converging the laser light expanded by the expander 55 in one axial direction (for example, in an X-axis direction).

Figure 12:
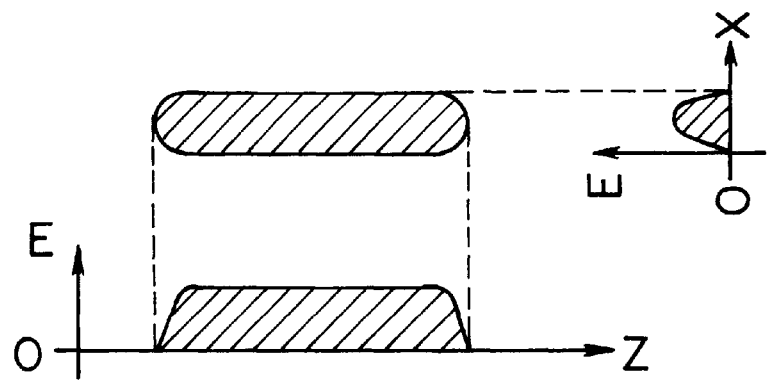
FIG. 12 is an explanatory diagram illustrating an energy distribution on the cross section of laser light before it passes through a homogenizer in the machining apparatus.
Figure 13:
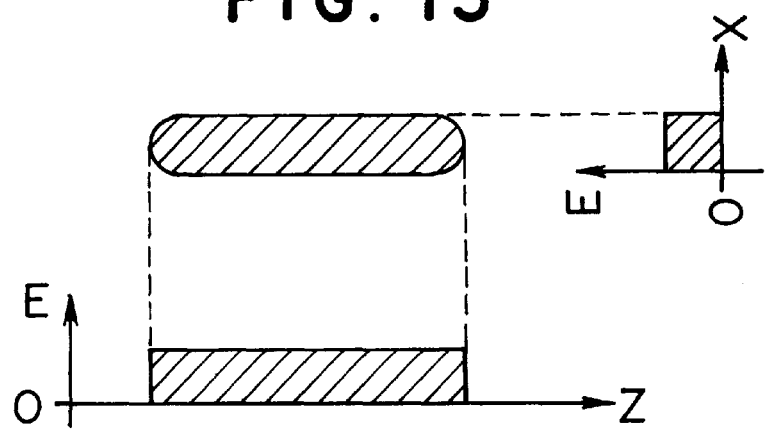
FIG. 13 is an explanatory diagram illustrating an energy distribution on the cross section of the laser light after it has passed through the homogenizer in the machining apparatus.

In the machining apparatus illustrated in FIG. 11, the formation of a slit 10 is stated with the transparent substrate 3 carried on the stage. More specifically, the controller moves the stage to a predetermined position such that the laser light is irradiated to the position of the slit 10 to be formed on the transparent substrate 3. Then, the controller controls the excimer laser 51 to irradiate laser light. The laser light from the excimer laser 51 (see FIG. 12) is processed by the homogenizer 52 to have a uniform intensity distribution on the cross section thereof (see FIG. 13), and then is reflected by the mirror 53. The laser light L reflected off the mirror 53 has a width in the longitudinal direction of the slit basically equal to the width of the laser light emitted from the excimer laser 51, and is too short to form the slit 10. Thus, the laser light reflected off the mirror 53 is expanded by the expander 55. The laser light is expanded in the direction along the longitudinal direction of the slit 10.

Subsequently, the laser light is converged by the cylindrical lens 56 in the X-axis direction. The convergence of the laser light by the cylindrical lens 56 is performed to extend the intensity distribution of the laser light in the X-axis direction to effectively utilize the energy of the laser light, as well as to reduce the width of the resulting slot 10.

Figure 14:
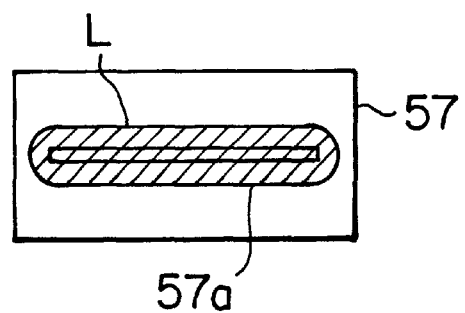
FIG. 14 is a top plan view of a slit member which may be used in the machining apparatus.

A slit member 57 for reducing the beam width, having a slit 57a slightly smaller than the laser light L as illustrated in FIG. 14, may be provided as required between the expander 55 and the cylindrical lens 56.

Figure 15A:
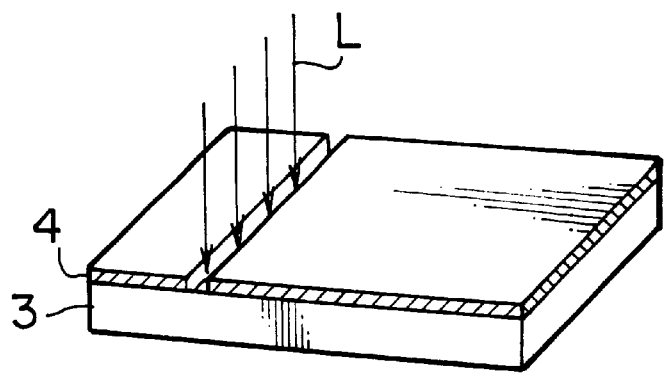
FIGS. 15A and 15B are a perspective view and a cross-sectional view, respectively, of an electrically conductive film on a transparent substrate while a slit is being formed.
Figure 15B:
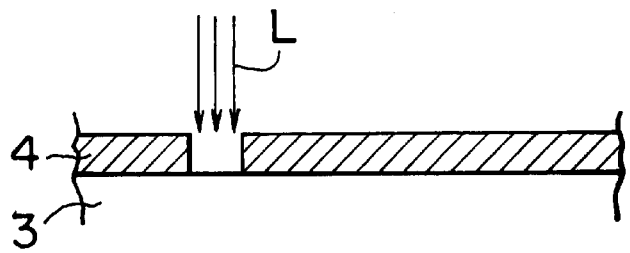

The laser light having the beam reshaped in the manner described above is irradiated to the electrically conductive film 4 made of ITO or the like formed on the transparent substrate 3 to form the slit 10 through the electrically conductive film 4, as illustrated in FIGS. 15A and 15B.

Subsequently, the controller controls the excimer laser 51 to stop the emission of the laser light L, and moves the stage. This causes the stage to move the position of the transparent substrate 3 such that the laser light is irradiated to the position at which another slit 10 is to be formed.

As described above, according to the third embodiment, since the laser light is reshaped into the shape of the slit 10 and then irradiated to the electrically conductive film 4, the slit 10 can be formed by irradiating the laser light to the electrically conductive film 4 only once. It is therefore possible to form a touch panel of a larger area at a lower cost as compared with the conventional method employing the photolithographic technology. Particularly, the photolithographic technology, which requires a preformed mask, presents poor performance in terms of cost and time for manufacturing a touch panel which is a minimal component, whereas the method according to the present invention utilizing enlarged laser light can readily form an arbitrary touch panel by previously supplying the controller with positional information on slits 10 to be formed.

While the third embodiment controls the excimer laser 51 to stop emitting the laser light each time another slit 10 is formed, the laser light may be continuously emitted if a shutter or the like is used to prevent the transparent substrate 3 from being irradiated with the laser light while the stage is being moved.

With the provision of such a shutter, a laser light irradiating time can be controlled, resulting in an advantage of facilitating to control the degree in which the transparent substrate 3 is machined by the laser light. In addition, since a time required for the excimer laser 51 to reach a normal oscillation is saved, the work efficiency can be improved.

The intensity distribution of the laser light finally irradiated to the electrically conductive film 4 gradually changes in end portions, so that the resulting slit 10 may often be formed in a U-shape in cross section. In such a case, the electrically conductive film 4 must be completely separated by increasing the irradiating time or by taking other measures, in which case, however, a longer irradiating time may possibly cause the laser light to machine the transparent substrate 3.

For avoiding such a trouble, a slit member 57 may be provided as mentioned above to shield end portions of the laser light to produce laser light which exhibits an intensity distribution changing in steps. With such laser light, the electrically conductive film 4 can be machined without damaging the transparent substrate 3.

Figure 16:
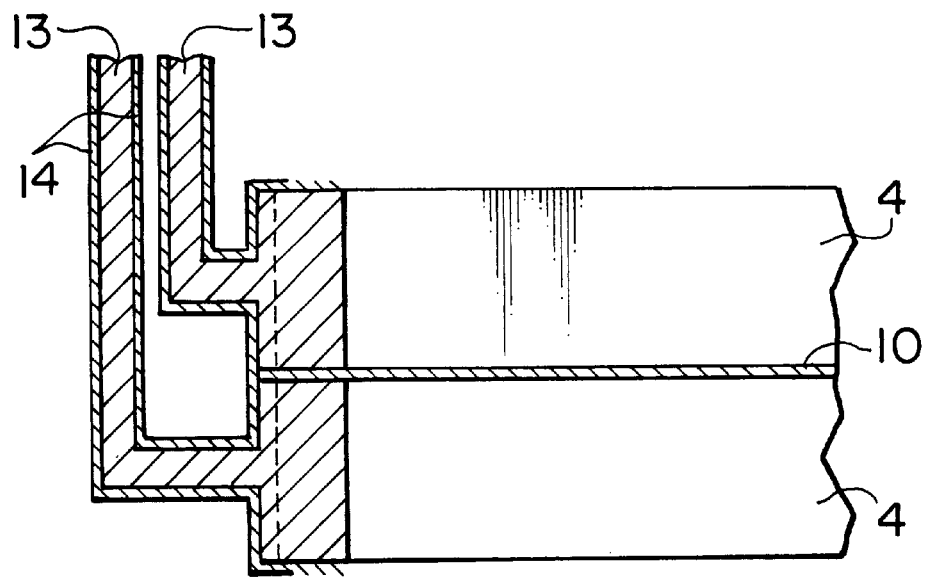
FIG. 16 is a schematic diagram illustrating a wiring pattern and slits bordering the wiring pattern in a peripheral portion of a touch panel.

While the foregoing embodiments have been described in connection with the machining for removing portions of the electrically conductive film 4 to form the slits 10 for defining respective transparent electrodes of a touch panel, the machining apparatus of the respective embodiments may also be used to form slits 14 for providing insulation between wires. As illustrated in FIG. 16, the slits 14 border a wire pattern 13 made of an electrically conductive paste (for example, a silver plate) formed on the surface of an electrically conductive layer 4 on an insulating substrate 3, in which case similar effects can be produced. The paste may be applied to the wiring pattern 13 either before or after the slits 14 are formed.

Also, while the foregoing embodiments have been described for the case where the present invention is applied to the machining of an electrically conductive film for forming transparent electrodes of a touch panel, the present invention is not limited to the touch panel, but may be applied likewise, for example, to machining an electrically conductive film for forming transparent electrodes of a liquid crystal panel, in which case similar effects can also be produced.

The first and second embodiments have employed a YAG laser as a heating laser light source for machining an electrically conductive film. The present invention, however, is also applicable when employing another infrared laser such as $CO_2$ laser, a visible light laser, an ultraviolet laser such as KrF excimer laser for removing an electrically conductive film mainly through abrasion, or the like.

The present invention is further applicable when using a light beam other than laser light, or another energy beam such as an X-ray beam, a charged particle beam or the like.

Obviously, numerous additional modifications and variations of the present invention are possible in light of the above teachings. It is therefore to be understood that within the scope of the appended claims, the present invention may be practiced otherwise than as specifically described herein.

What is claimed is:

1. A method of machining a transparent electrically conductive film formed on a surface of a transparent insulating substrate to remove portions of said transparent electrically conductive film by selectively irradiating a laser beam to said transparent electrically conductive film on said transparent insulating substrate, said method comprising the steps of:

mounting the transparent insulating substrate with the transparent electrically conductive film onto a substrate carrier including a recess below at least a portion of the transparent insulating substrate to be irradiated with said laser beam;

making uniform an energy distribution on a cross section of said laser beam; and controlling said laser beam based on an output of a sensor for sensing a moving distance of said transparent insulating substrate in such a manner that a repeating period of said laser beam is changed in accordance with a moving speed of said transparent insulating substrate.

2. The method of machining a transparent electrically conductive film formed on a surface of a transparent insulating substrate to remove portions of said transparent electrically conductive film by selectively irradiating a laser beam to said transparent electrically conductive film on said transparent insulating substrate according to claim 1 wherein, said transparent electrically conductive film has a wiring pattern, said method further comprising the step of:

irradiating the uniform laser beam to said transparent electrically conductive film to form slits along said wiring pattern on said transparent electrically conductive film for providing insulation between wires.

3. An apparatus for machining a transparent electrically conductive film formed on a surface of a transparent insulating substrate to remove portions of said transparent electrically conductive film by selectively irradiating a laser beam to said transparent electrically conductive film on said transparent insulating substrate, comprising:

a laser beam source for emitting a laser beam;

laser beam irradiating means for making uniform an energy distribution on a cross section of said laser beam from said laser beam source, and for selectively irradiating the uniform laser beam to said transparent electrically conductive film on said transparent insulating substrate;

substrate holding means for holding said transparent insulating substrate and including a recess below at least a portion of the transparent insulating substrate to be irradiated with said laser beam;

driving means for driving at least one of said substrate holding means and said laser beam irradiating means so as to relatively move said transparent insulating substrate and said laser beam for irradiation;

a sensor for sensing a moving distance of said transparent insulating substrate; and control means for controlling said laser beam irradiating means based on an output of said sensor in such a manner that a repeating period of said laser beam is changed in accordance with a moving speed of said transparent insulating substrate.

4. The apparatus according to claim 3, wherein a path for irradiating said laser beam is fixed, and said substrate holding means is driven so as to move said transparent insulating substrate in a direction intersecting a laser beam irradiation direction.

5. The apparatus according to claim 4, wherein: said laser beam irradiating means includes an optical system for making uniform the energy distribution on the cross section of the laser beam from said laser beam source and for selectively irradiating the uniform laser beam to said transparent electrically conductive film on said transparent insulating substrate.

6. The apparatus according to claim 3, wherein said transparent insulating substrate is fixed at a position, and said laser beam irradiating means is driven so as to move a laser beam irradiation position in a direction intersecting a laser beam irradiation direction.

7. The apparatus according to claim 6, wherein: said laser beam irradiating means includes an optical system for making uniform the energy distribution on the cross section of the laser beam from said laser beam source and for selectively irradiating the uniform laser beam to said transparent electrically conductive film on said transparent insulating substrate.

8. The apparatus according to claim 3, wherein: said laser beam irradiating means includes an optical system for making uniform the energy distribution on the cross section of the laser beam from said laser beam source and for selectively irradiating the uniform laser beam to said transparent electrically conductive film on said transparent insulating substrate.

9. The apparatus according to claim 8, wherein said optical system for making uniform the energy distribution on the cross section of the laser light includes a kaleidoscope.

10. The apparatus according to claim 9, further comprising an optics for converging laser beam exiting from said kaleidoscope onto said transparent electrically conductive film.

11. The apparatus according to claim 8, wherein said optical system includes an optical fiber for guiding said laser beam to the vicinity of said transparent electrically conductive film on said transparent insulating substrate, while making uniform the energy distribution of the laser beam emitted from said laser beam source through refraction and reflection in an internal light transmission path.

12. The apparatus according to claim 11, further comprising an optics for converging laser beam exiting from said optical fiber into said electrically conductive film.

13. The apparatus according to claim 11, wherein said optical fiber is a step-index optical fiber having a core about a central axis.

14. The apparatus according to claim 13, further comprising an optics for converging laser beam exiting from said optical fiber into said electrically conductive film.

15. An apparatus for machining a transparent electrically conductive film formed on a surface of a transparent insulating substrate to remove portions of said transparent electrically conductive film by selectively irradiating a laser beam to said transparent electrically conductive film on said transparent insulating substrate, comprising:

a laser beam source for emitting a laser beam;

laser beam irradiating means for making uniform an energy distribution on a cross section of said laser beam from said laser beam source and for selectively irradiating the uniform laser beam to said transparent electrically conductive film on said transparent insulating substrate;

substrate holding means for holding said transparent insulating substrate and including a recess below at least a portion of the transparent insulating substrate to be irradiated with said laser beam;

driving means for driving at least one of said substrate holding means and said laser beam irradiating means so as to relatively move said transparent insulating substrate and said laser beam for irradiation;

a sensor for sensing a moving distance of said transparent insulating substrate; and control means for controlling said laser beam irradiating means based on an output of said sensor in such a manner that a repeating period of said laser beam is changed in accordance with a moving speed of said transparent insulating substrate, thereby forming slits along a wiring pattern formed on said transparent electrically conductive film for providing insulation between wires.

* * * * *

UNITED STATES PATENT AND TRADEMARK OFFICE
CERTIFICATE OF CORRECTION

PATENT NO. : 6,300,594 B1
DATED : October 9, 2001
INVENTOR(S) : Kinoshita et al.

It is certified that error appears in the above-identified patent and that said Letters Patent is hereby corrected as shown below:

Column 8,
Line 5, change "to" (first occurrence) to -- so --.

Column 9,
Line 47, in the first occurrence, change "of" to -- on --.

Column 11,
Line 31, change "nm" to -- mm --;
Lines 33-34, change "100 nm x 700 nm" to -- 700 mm x 700 mm --;
Line 36, in both occurrences change "nm" to -- mm --;
Line 40, in second occurrence, delete "in".

Column 15,
Line 1, change "wire" to -- wiring --.

Signed and Sealed this

Seventh Day of May, 2002

*Attest:*

*Attesting Officer*

JAMES E. ROGAN
*Director of the United States Patent and Trademark Office*